United States Patent
Lee et al.

(10) Patent No.: US 6,377,093 B1
(45) Date of Patent: Apr. 23, 2002

(54) TIME-TO-DIGITAL CONVERTER AND LOCKING CIRCUIT AND METHOD USING THE SAME

(75) Inventors: Dong-yun Lee; Kee-wook Jung, both of Sungnam (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/552,424

(22) Filed: Apr. 19, 2000

(30) Foreign Application Priority Data

May 15, 1999 (KR) ............................................. 99-17506
Oct. 13, 1999 (KR) ............................................. 99-44298

(51) Int. Cl.[7] ................................................ H03L 7/00
(52) U.S. Cl. ........................................ 327/161; 327/276
(58) Field of Search ................................. 327/161, 261, 327/262, 243, 153, 158, 270, 271, 272, 274, 276, 277, 278, 280, 281, 284, 292; 341/111, 112, 114, 155, 166; 375/371, 226; 331/25, DIG. 2

(56) References Cited

U.S. PATENT DOCUMENTS

| | | | | |
|---|---|---|---|---|
| 4,922,141 A | * | 5/1990 | Lofggren et al. | ............ 327/158 |
| 5,298,867 A | * | 3/1994 | Mestha | ........................ 327/261 |
| 5,486,783 A | | 1/1996 | Baumert et al. | ............. 327/147 |
| 5,828,257 A | * | 10/1998 | Masleid | ........................ 327/276 |
| 5,838,754 A | * | 11/1998 | Gorbics et al. | ................ 377/20 |
| 5,852,380 A | | 12/1998 | Yamauchi | ..................... 327/243 |
| 5,999,027 A | * | 12/1999 | Yamazaki | ..................... 327/161 |

FOREIGN PATENT DOCUMENTS

WO  WO00/10252  2/2000

* cited by examiner

Primary Examiner—Kenneth B. Wells
Assistant Examiner—Linh Nguyen
(74) Attorney, Agent, or Firm—Mills & Onello LLP

(57) ABSTRACT

An integrated circuit having a locking circuit and method using the same are provided. The locking circuit includes a time-to-digital converter. The time-to-digital converter includes first and second delay chains, each for delaying one of two input signals at predetermined intervals. The time-to-digital converter also includes first and second phase comparators, each for comparing the delayed signal with the other signal and generating a digital signal. The locking circuit converts the phase difference between a feedback signal and an internal clock signal into a delay control signal group using the time-to-digital converter. The delay control signal group controls the delay time of a mirror delay circuit to rapidly minimize the phase difference between the feedback signal and the internal clock signal.

34 Claims, 7 Drawing Sheets

TIME-TO-DIGITAL CONVERTER AND LOCKING CIRCUIT AND METHOD USING THE SAME

BACKGROUND OF THE INVENTION

1. Field of the Invention

The present invention relates to an integrated circuit, and more particularly, to a converter for converting into a digital signal the difference between the times at which two signals are input and a locking circuit and method for generating a periodic signal such as a clock signal using the converter.

2. Description of the Related Art

Integrated circuits which operate at high speed require locking circuits for generating periodic signals which have a synchronous relationship with reference clock signals. In particular, semiconductor products such as synchronous dynamic random access memories (SDRAM) require locking circuits.

A locking circuit in a SDRAM generates internal clock signals which are synchronized with reference clock signals. The SDRAM drives its internal circuits, which are related to the input of data and the input/output of commands, based on the internal clock signals. Generally, a locking circuit generates an internal clock signal having the same phase as that of a reference clock signal, using a feedback circuit. An internal circuit using the internal clock signal generated by the locking circuit may be physically located at a different position to the locking circuit in a memory chip. Accordingly, a skew, in which an internal clock signal actually used in an internal circuit does not have the same phase as that of a feedback signal that is controlled by a feedback circuit, may occur. The skew causes the phase difference between an internal clock signal which is actually used in an internal circuit and a reference clock signal.

Designers of locking circuits have tried to minimize the phase difference between an internal clock signal actually used in an internal circuit and a reference clock signal. A representative locking circuit is a delay locked loop.

As shown in FIG. 1, in a conventional delay locked loop, a phase detector 105 compares a reference clock signal ECLK with a feedback signal FCLK1. The phase detector 105 provides a phase difference signal DET to a delay unit 101. The phase difference signal DET corresponds to the phase difference between the reference clock signal ECLK and the feedback signal FCLK1 and is controlled over its activation width. The delay time of the delay unit 101 is controlled by the activation width of the phase difference signal DET. A clock driver 103 is driven by a delay clock signal DCLK output from the delay unit 101 and generates an internal clock signal ICLK. A mirror delay circuit 107 reflects path delay from an output terminal of the clock driver 103 to the point at which the internal clock signal ICLK is actually used. In other words, the mirror delay circuit 107 delays an auxiliary clock signal FCLK0, which has an identical phase to that of the internal clock signal ICLK at the output terminal of the clock driver 103, by the path delay of the internal clock signal ICLK to generate a feedback signal FCLK1.

The delay time of the mirror delay circuit 107 may be changed by fabrication conditions, temperature and the value of the power supply voltage. A change of the delay time causes the phase difference between a feedback signal and an internal clock signal that is actually used in an internal circuit. In addition, the mirror delay circuit in a conventional delay locked loop has a fixed delay time. Accordingly, the phase difference between a feedback signal and an internal clock signal cannot be controlled. Consequently, there is a problem in that the phase difference between a feedback signal and an internal clock signal causes the phase difference between an internal clock signal which is provided by a conventional delay locked loop and a reference clock signal.

SUMMARY OF THE INVENTION

To solve the above problems, it is an object of the present invention to provide an integrated circuit having a locking circuit for minimizing the phase difference between a reference clock signal and an internal clock signal.

It is another object of the present invention to provide a locking method for minimizing the phase difference between a reference clock signal and an internal clock signal using the locking circuit.

In one aspect, the present invention provides an integrated circuit having a locking circuit for generating an internal clock signal in synchronization with an input reference clock signal. The internal clock signal is obtained when an initial internal clock signal at an output terminal of the locking circuit is delayed by a predetermined time for which the initial internal clock signal is transmitted from the output terminal to an input terminal of a circuit at a predetermined distance from the output terminal. The locking circuit includes an internal clock signal generator for delaying the reference clock signal by a first delay time corresponding to the phase difference between the reference clock signal and a feedback signal which is controlled to have the same phase as that of the internal clock signal. The internal clock signal generator generates the initial internal clock signal based on the delayed reference clock signal. A mirror delay circuit delays the initial internal clock signal by a second delay time in response to a predetermined delay control signal group and generates the feedback signal. A time-to-digital converter generates the delay control signal group for controlling the mirror delay circuit to reduce the phase difference between the feedback signal and the internal clock signal.

In another aspect, the present invention provides an integrated circuit having a locking circuit for generating an internal clock signal in synchronization with an input reference clock signal. The internal clock signal is obtained when an initial internal clock signal at an output terminal of the locking circuit is delayed by a predetermined time for which the initial internal clock signal is transmitted from the output terminal to an input terminal of a circuit at a predetermined distance from the output terminal. The locking circuit includes an internal clock signal generator for delaying the reference clock signal by a first delay time corresponding to the phase difference between the reference clock signal and a feedback signal which is controlled to have the same phase as that of the internal clock signal. The internal clock signal generator generates the initial internal clock signal and an auxiliary clock signal based on the delayed reference clock signal. A mirror delay circuit delays the auxiliary clock signal by a second delay time in response to a predetermined delay control signal group and generates the feedback signal. A time-to-digital converter generates the delay control signal group for controlling the mirror delay circuit to reduce the phase difference between the feedback signal and the internal clock signal.

In still another aspect, the present invention provides an integrated circuit having a locking circuit for generating an internal clock signal in synchronization with an input reference clock signal. The internal clock signal is obtained when an initial internal clock signal at an output terminal of the locking circuit is delayed by a predetermined time for which the initial internal clock signal is transmitted from the output terminal to an input terminal of a circuit at a predetermined distance from the output terminal. The locking circuit includes an internal clock signal generator for delaying the reference clock signal by a first delay time corresponding to the phase difference between the reference clock signal and a feedback signal which is controlled to have the same phase as that of the internal clock signal. The internal clock signal generator generates a pre-clock signal and the feedback signal based on the delayed reference clock signal. A variable delay circuit delays the pre-clock signal by a second delay time in response to a predetermined delay control signal group and generates the initial internal clock signal. A time-to-digital converter generates the delay control signal group for controlling the variable delay circuit to reduce the phase difference between the feedback signal and the internal clock signal.

In yet another aspect of the present invention, there is provided a locking method for generating an internal clock signal which is synchronized with an input reference clock signal. In accordance with the locking method, the reference clock signal is delayed by a first delay time corresponding to the phase difference between the reference clock signal and a feedback signal which is controlled to have the same phase as that of the internal clock signal. An initial internal clock signal and an auxiliary clock signal are generated based on the delayed reference clock signal. The auxiliary clock signal is delayed by a second delay time, and the feedback signal is generated. The phase difference between the internal clock signal and the feedback signal is detected, and the phase difference between the internal clock signal and the feedback signal is converted into a digital signal. A predetermined delay control signal group based on the digital signal is generated, and the second delay time is controlled according to the delay control signal group to reduce the phase difference between the feedback signal and the internal clock signal.

According to the integrated circuit having a locking circuit of the present invention, the phase difference between two input signals is readily converted into a digital signal. Moreover, according to the locking circuit and method of the invention, the phase difference between a feedback signal and an internal clock signal is quickly reduced within a short time.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

The present invention will now be described more fully with reference to the accompanying drawings, in which preferred embodiments of the invention are shown. The present invention may be applied to various kinds of locking circuits. However, for illustrative purpose, a delay locked loop is exemplified as the locking circuit in this description.

Figure 1:
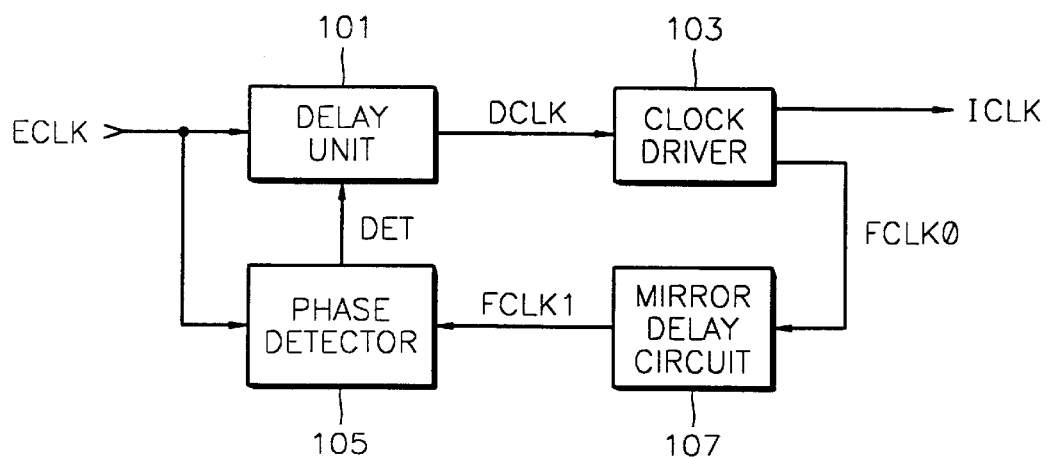
FIG. 1 is a block diagram of a conventional delay locked loop.
Figure 2:
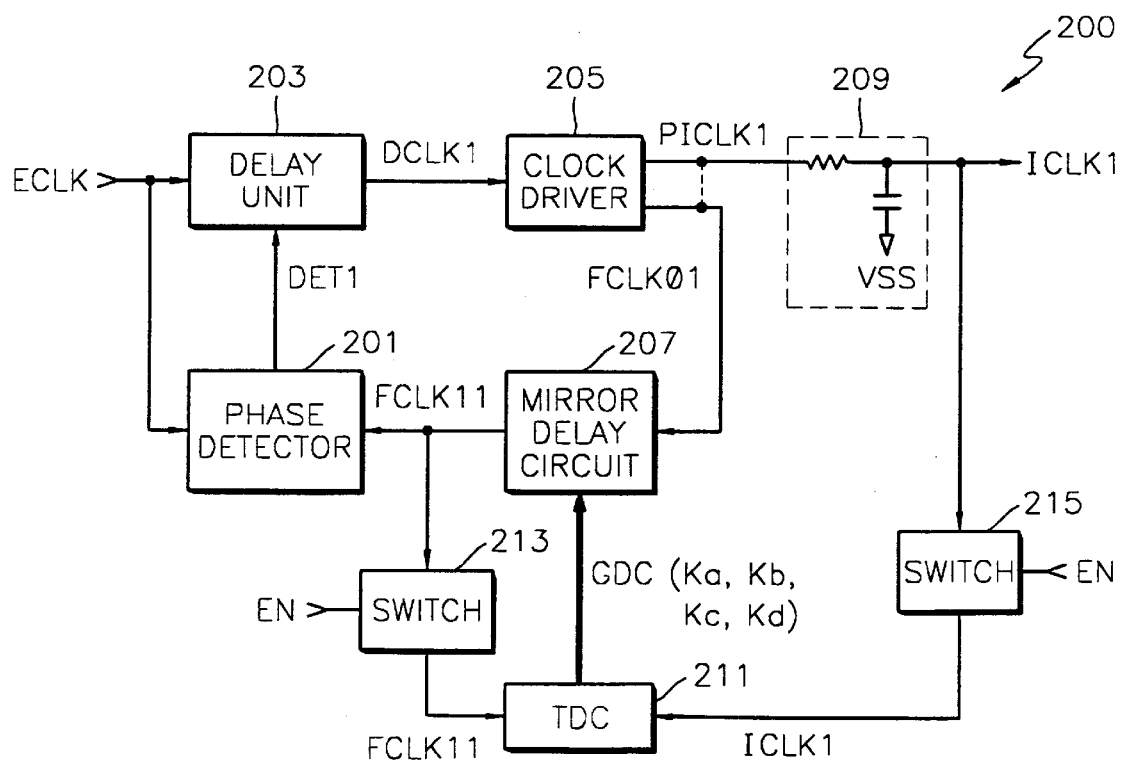
FIG. 2 is a schematic block diagram of a delay locked loop according to an embodiment of the present invention.

Referring to FIG. 2, a delay locked loop 200 according to an embodiment of the present invention includes a phase detector 201, a delay unit 203, a clock driver 205, a mirror delay circuit 207 and a time-to-digital converter (TDC) 211. The phase detector 201 detects the phase difference between a reference clock signal ECLK and a feedback signal FCLK11 and generates a phase difference signal DET1 having a voltage level corresponding to the detected phase difference. The delay unit 203 delays the reference clock signal ECLK by a first delay time, which is controlled by the phase difference signal DET1, to generate a delay clock signal DCLK1.

The delay clock signal DCLK1 drives the clock driver 205. The clock driver 205 generates an initial internal clock signal PICLK1 and an auxiliary clock signal FCLK01. The auxiliary clock signal FCLK01 may be the same signal as the internal clock signal ICLK1, which is shown as a dotted line that is connecting the auxiliary clock signal FCLK01 and the initial internal clock signal PICLK01. The clock driver 205 ultimately generates an internal clock signal ICLK1. As mentioned before, it is desirable that the locking circuit such as a delay locked loop generate a clock signal which is accurately synchronized with a reference clock signal ECLK. For convenience' sake in this specification, a signal at the output terminal of the clock driver 205, i.e., the output terminal of a delay locked loop, is called the initial internal clock signal PICLK1. A clock signal at a circuit which actually uses the clock signal is called the internal clock signal ICLK1. Parasitic resistance and capacitance, which can be created between the initial internal clock signal PICLK1 and the internal clock signal ICLK1, is modeled and represented by reference numeral 209. The reference numeral 209 indicates resistance and capacitance elements which are usually created when the initial internal clock signal PICLK1 is transmitted as the internal clock signal ICLK1 and cannot be eliminated by circuit designers. In this specification, the combination of the phase detector 201, the delay unit 203 and the clock driver 205 is called an internal clock signal generator.

The mirror delay circuit 207 reflects the delay from the output terminal of the clock driver 205 to a circuit in which the internal clock signal ICLK1 is used. The mirror delay circuit 207 delays the auxiliary clock signal FCLK01 which is another output signal of the clock driver 205 by a second delay time to generate a feedback signal FCLK11. Meanwhile, the mirror delay circuit 207 may delay the initial internal clock signal PICLK1, as shown by the dotted line. Preferably, the second delay time is the same as the delay time of the modeled resistance and capacitance represented by the reference numeral 209. The auxiliary clock signal FCLK01 may be the same signal as the initial internal clock signal PICLK1. In the preferred embodiment, the second delay time of the mirror delay circuit 207 is controlled by a delay control signal group GDC which is output from the time-to-digital converter (TDC) 211.

Figure 3:
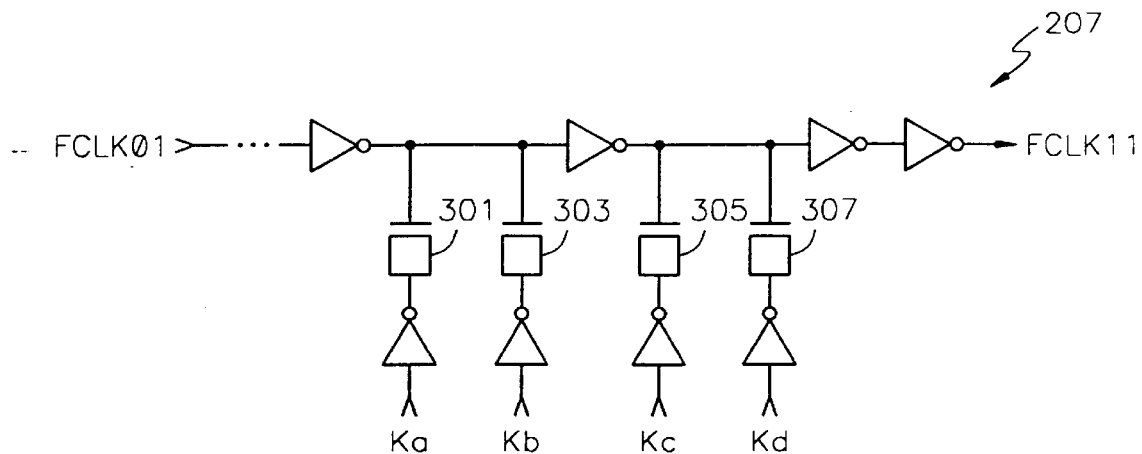
FIG. 3 is a detailed circuit diagram of one embodiment of the mirror delay circuit of FIG. 2.

FIG. 3 is a circuit diagram of a specific example of the mirror delay circuit 207 of FIG. 2. Referring to FIG. 3, the mirror delay circuit 207 is connected to a signal transmission path and composed of a plurality of invertors and capacitors 301, 303, 305 and 307, which have variable capacitance, connected between the invertors. The capacitance of the capacitors is controlled by inverted signals Ka, Kb, Kc and Kd of the delay control signal group GDC, respectively. The capacitances of the capacitors are preferably implemented as different sizes to vary the delay time of the mirror delay circuit 207. In one embodiment, the capacitance of the capacitors 303 and 307 is about twice that of the capacitors 301 and 305.

Various other configurations of the mirror delay circuit 207 which is controlled to have various delay times are disclosed in, for example, Korean Patent Application No. 48168, entitled "Delay Circuit and Method for Delaying Signal Using the Same", filed in 1998 and Korean Patent Application No. 15892, entitled "Signal Transmission Circuit Having Load Controller in Semiconductor Integrated Circuit and Method for Controlling Transmission Time Using the Same", filed in 1999, by the present applicant. Those applications are incorporated herein in their entirety by reference.

Referring to FIG. 2, the TDC 211 generates the delay control signal group GDC in response to the phase difference between the feedback signal FCLK11 and the internal clock signal ICLK1. The delay control signal group GDC adjusts the delay time of the mirror delay circuit 207 to reduce the phase difference between the feedback signal FCLK11 and the internal clock signal ICLK1.

Switches 213 and 215 are enabled in response to an enable signal EN and provide signals, which respectively have the same timing as the feedback signal FCLK11 and the internal clock signal ICLK1, to the TDC 211. Accordingly, for convenience' sake, the signals before and after transmission through the switches 213 and 215 are not distinguished and are referred to as the feedback signal FCLK11 and the internal clock signal ICLK1, respectively.

Figure 4:
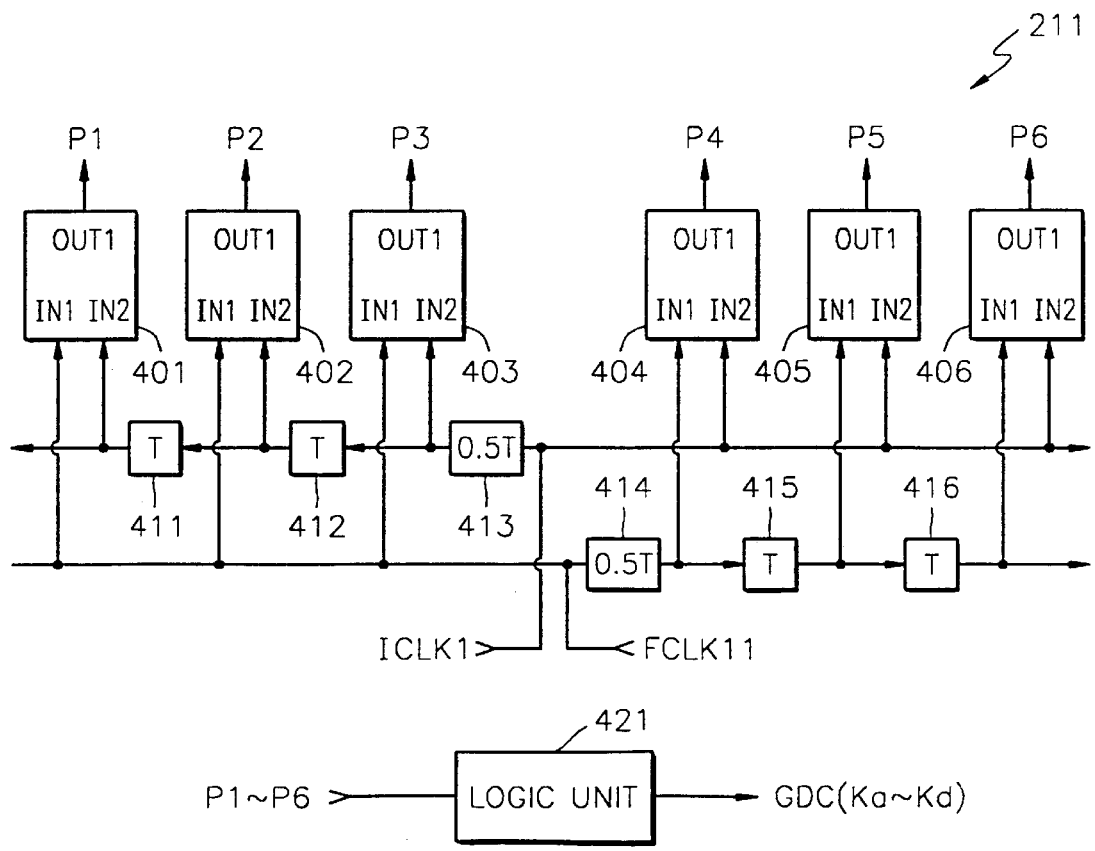
FIG. 4 is a detailed circuit diagram of one embodiment of the time-to-digital converter of FIG. 2.

FIG. 4 is a detailed circuit diagram showing one embodiment of the TDC 211 of FIG. 2. Referring to FIG. 4, the TDC 211 converts the phase difference between the feedback signal FCLK11 and the internal clock signal ICLK1 into the delay control signal group GDC. The TDC 211 includes a first phase comparator group 401, 402 and 403, a second phase comparator group 404, 405 and 406, and a logic unit 421.

The first phase comparators 401, 402 and 403 sequentially delay the internal clock signal ICLK1 and compare the delayed signals with the feedback signal FCLK11 using a delay chain which is composed of delay units 411, 412 and 413. In other words, the first phase comparator 403 delays the internal clock signal ICLK1 by 0.5T and compares the delayed signal with the feedback signal FCLK1 1. Here, T may indicate a minimum delay time which is varied by the capacitors 301, 303, 305 and 307 of FIG. 3. The first phase comparators 402 and 401 delay the internal clock signal ICLK1 by 1.5T and 2.5T, respectively, and compare the delayed signals with the feedback signal FCLK11.

The second phase comparators 404, 405 and 406 sequentially delay the feedback signal FCLK11 and compare the delayed signals with the internal clock signal ICLK1 using a delay chain which is composed of delay units 414, 415 and 416. In other words, the second phase comparator 404 delays the feedback signal FCLK11 by 0.5T and compares the delayed signal with the internal clock signal ICLK1. The second phase comparators 405 and 406 delay the feedback signal FCLK11 by 1.5T and 2.5T, respectively, and compare the delayed signals with the internal clock signal ICLK1.

The TDC 211 may be enabled by the activation of an enable signal EN (not shown). The structure of a circuit which is enabled by the activation of an enable signal is very easily implemented by those skilled in the art. The enable signal EN is generated at the initial state of normal operation or during either a non-reading operation or a non-writing operation.

Output signals P1 through P6 of the first phase comparators 401, 402 and 403 and the second phase comparators 404, 405 and 406 are combined by the logic unit 421 to generate the signals Ka, Kb, Kc and Kd of the delay control signal group GDC. One example of the combination of the output signals of the first and second phase comparators for generating the delay control signal group GDC is shown in Table 1.

TABLE 1

| Cases | Output signals of first and second phase comparators | | | | | | Delay control signal group (GDC) | | | |
|---|---|---|---|---|---|---|---|---|---|---|
| | P1 | P2 | P3 | P4 | P5 | P6 | ka | kb | kc | kd |
| 1 | 0 | 0 | 0 | 0 | 0 | 0 | 0 | 0 | 0 | 0 |
| 2 | 1 | 0 | 0 | 0 | 0 | 0 | 1 | 0 | 0 | 0 |
| 3 | 1 | 1 | 0 | 0 | 0 | 0 | 0 | 1 | 0 | 0 |
| 4 | 1 | 1 | 1 | 0 | 0 | 0 | 1 | 1 | 0 | 0 |
| 5 | 1 | 1 | 1 | 1 | 0 | 0 | 1 | 1 | 1 | 0 |
| 6 | 1 | 1 | 1 | 1 | 1 | 0 | 1 | 1 | 0 | 1 |
| 7 | 1 | 1 | 1 | 1 | 1 | 1 | 1 | 1 | 1 | 1 |

Here, "1" indicates a logic high and "0" indicates a logic low.

In this embodiment, in case 4 of Table 1, the phase of the feedback signal FCLK11 is almost the same as that of the internal clock signal ICLK1. In other words, in case 4, the phase difference between the feedback signal FCLK11 and the internal clock signal ICLK1 is smaller than 0.5T. In this case, the signals Ka and Kb are at a logic high. Accordingly, the capacitors 301 and 303 of FIG. 3 function as delay factors with respect to transmitted signals, but the capacitors 305 and 307 do not function as delay factors.

In case 3 of Table 1, the phase of the internal clock signal ICLK1 precedes that of the feedback signal FCLK11 by the range from 0.5T to 1.5T. In this case, only the signal Kb is at a logic high. In other words, the phase of the feedback signal FCLK11 is advanced by the time T, as compared with case 4.

In case 5, the phase of the internal clock signal ICLK1 is the range from 0.5T to 1.5T behind that of the feedback signal FCLK11. In this case, the signals Ka, Kb and Kc are at a logic high. In other words, the phase of the feedback signal FCLK11 is delayed by the time T, as compared with case 4.

Among the phase comparators shown in FIG. 4, the first phase comparators 401, 402 and 403 depicted on the left decrease the delay time of the mirror delay circuit 207 of FIG. 2 when the phase of the internal clock signal ICLK1 is earlier than that of the feedback signal FCLK11. The second phase comparators 404, 405 and 406 depicted on the right increase the delay time of the mirror delay circuit 207 when the phase of the internal clock signal ICLK1 is later than that of the feedback signal FCLK11. The phase of the feedback signal FCLK11 is controlled to reduce the phase difference between the internal clock signal ICLK1 and the feedback signal FCLK11.

In the operation of the TDC 211, once the enable signal EN is activated, the feedback signal FCLK11 and the internal clock signal ICLK1 are sampled. The sampled feedback signal FCLK11 and internal clock signal ICLK1 are transmitted to the TDC 211 through paths having the same physical and electrical characteristics. The TDC 211 converts the phase difference between the feedback signal FCLK11 and the internal clock signal ICLK1 into a digital code.

Figure 5:
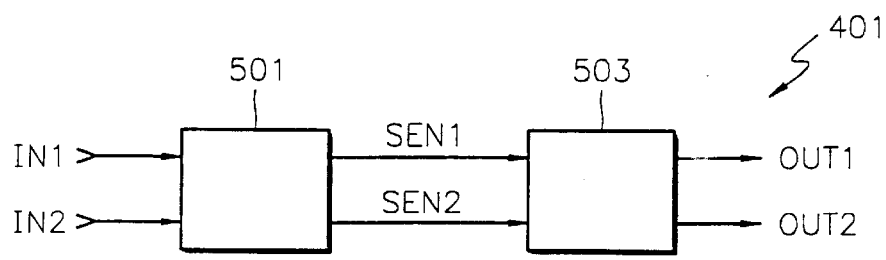
FIG. 5 is a block diagram showing one embodiment of a phase comparators of FIG. 4.

FIG. 5 is a block diagram showing one embodiment of one of the first and second phase comparators of FIG. 4. In one embodiment, the first and second phase comparators have the same structure. The first phase comparator 401 is representatively described in this specification.

The first phase comparator 401 includes a pre-latch circuit 501 and a final latch circuit 503. The pre-latch circuit 501 receives two input signals IN1 and IN2 via first and second input terminals, respectively. Then, the pre-latch circuit 501 generates first and second sensing signals SEN1 and SEN2. The first and the second sensing signals SEN1 and SEN2 are activated depending on the order of the phases of the input signals IN1 and IN2. The final latch 503 receives the first and the second sensing signals SEN1 and SEN2 and generates first and second output signals OUT1 and OUT2.

Referring to FIG. 4, the first input signal IN1 which is input via the first input terminal is coupled to the feedback signal FCLK11. The second input signal IN2 which is input via the second input terminal is coupled to a signal which is obtained by delaying the internal clock signal ICLK1 using the delay units 411, 412 and 413. The first output signal OUT1 is coupled to the output signal P1 of the first phase comparator 401.

Figure 6:
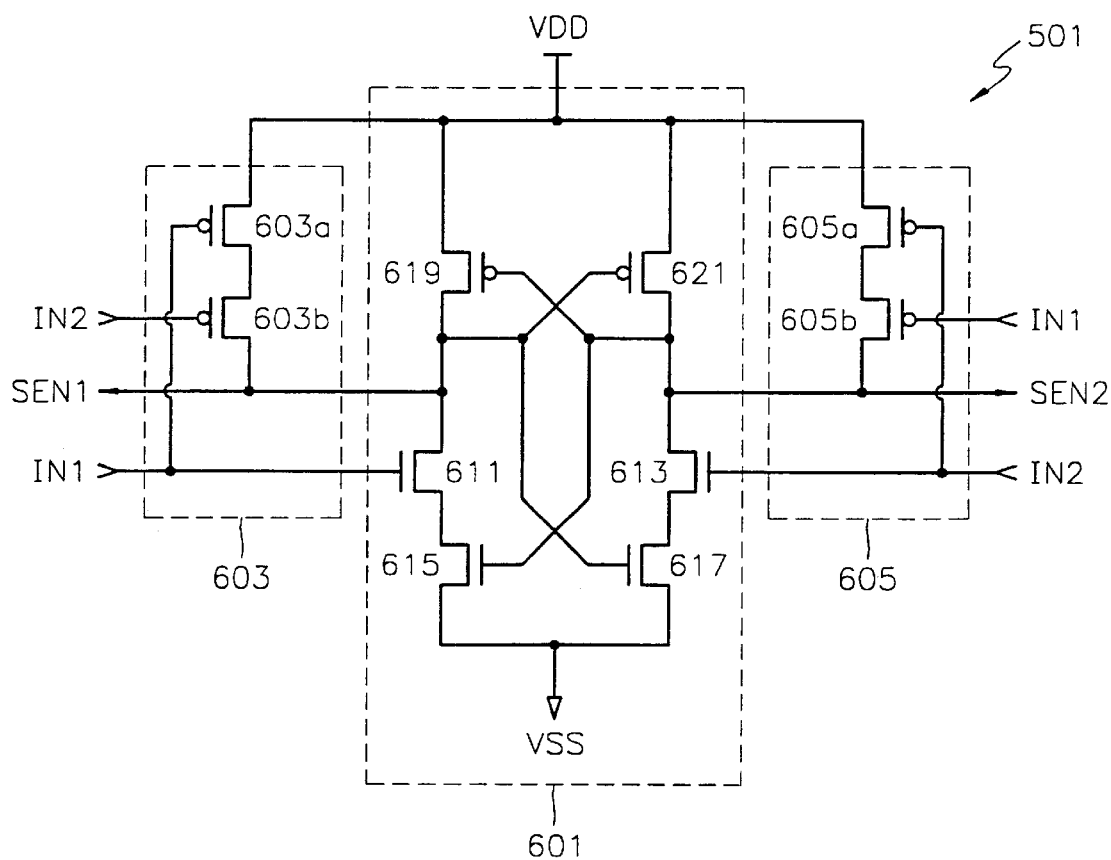
FIG. 6 is a detailed circuit diagram of one embodiment of a pre-latch circuit of FIG. 5.

FIG. 6 is a specific circuit diagram of one embodiment of the pre-latch circuit 501 of FIG. 5. Referring to FIG. 6, the pre-latch circuit 501 includes a latch 601 and first and second precharging units 603 and 605.

The latch 601 receives the first and the second input signals IN1 and IN2 and generates the first and the second sensing signals SEN1 and SEN2. In one embodiment, the latch 601 includes a plurality of NMOS transistors 611, 613, 615 and 617 and a plurality of PMOS transistors 619 and 621.

The NMOS transistor 611 is gated with the first input signal IN1. A first junction of the NMOS transistor 611 is coupled to a node of the first sensing signal SEN1. The NMOS transistor 613 is gated with the second input signal IN2. A first junction of the NMOS transistor 613 is coupled to a node of the second sensing signal SEN2.

The NMOS transistor 615 includes first and second junctions which are coupled to the second junction of the NMOS transistor 611 and a ground voltage VSS, respectively. The NMOS transistor 615 is gated with the second sensing signal SEN2. The NMOS transistor 617 includes first and second junctions which are coupled to the second junction of the NMOS transistor 613 and the ground voltage VSS, respectively. The NMOS transistor 617 is gated with the first sensing signal SEN1.

The PMOS transistor 619 includes first and second junctions which are coupled to the first junction of the NMOS transistor 611 and a power supply voltage VDD, respectively. The PMOS transistor 619 is gated with the second sensing signal SEN2. The PMOS transistor 621 includes first and second junctions which are coupled to the first junction of the NMOS transistor 613 and the power supply voltage VDD, respectively. The PMOS transistor 621 is gated with the first sensing signal SEN1.

The first precharging unit 603 is composed of PMOS transistors 603a and 603b which are respectively gated with the first and the second input signals IN1 and IN2. The PMOS transistors 603a and 603b are connected in series between the power supply voltage VDD and the node of the first sensing signal SEN1. Accordingly, in a precharging state in which the first and the second input signals IN1 and IN2 are at a logic low, the first sensing signal SEN1 is at a logic high.

The second precharging unit 605 is composed of PMOS transistors 605a and 605b which are respectively gated with the second and first input signals IN2 and IN1. The PMOS transistors 605a and 605b are connected in series between the power supply voltage VDD and the node of the second sensing signal SEN2. Accordingly, in a precharging state in which the first and the second input signals IN1 and IN2 are at a logic low, the second sensing signal SEN2 is at a logic high.

Figure 7:
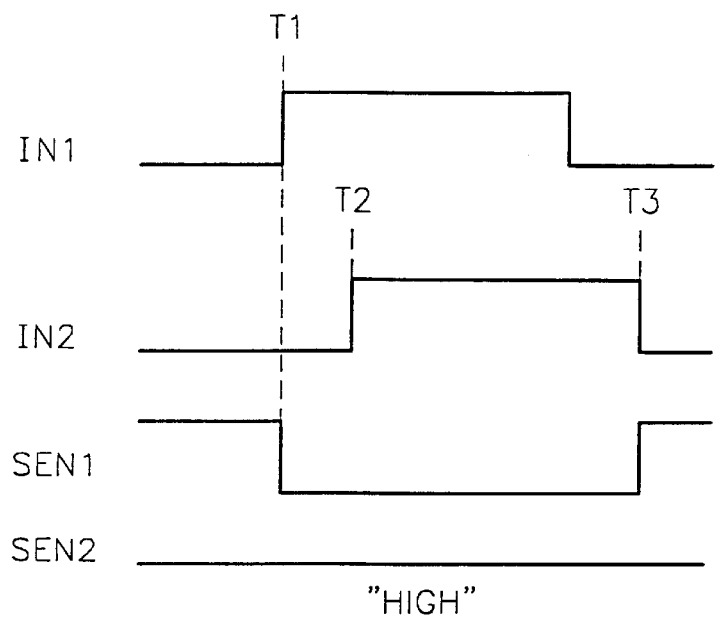
FIGS. 7 and 8 are timing diagrams of output signals of the pre-latch circuit of FIG. 6, which show the case where a first input signal precedes a second input signal in phase and the case where the second input signal precedes the first input signal in phase, respectively.

FIG. 7 is a timing diagram of the output signals of the pre-latch circuit 501 of FIG. 6 which shows a case where the first input signal IN1 precedes the second input signal IN2 in phase. Referring to FIGS. 6 and 7, in a state in which the first and the second input signals IN1 and IN2 are at a logic low, the first and the second sensing signals SEN1 and SEN2 are precharged to a logic high. At a time point T1 when the first input signal IN1 goes to a logic high, the first sensing signal SEN1 goes to a logic low. However, at a time point T2 when the second input signal IN2 goes to a logic high, the second sensing signal SEN2 remains at a logic high state. The reason that the second sensing signal SEN2 remains at the logic high state is that the NMOS transistor 617 has already been turned off by the first sensing signal SEN1 which has gone to a logic low. At a time point T3 when both the first and second input signals IN1 and IN2 are at a logic low, the first sensing signal SEN1 goes to a logic high.

Figure 8:
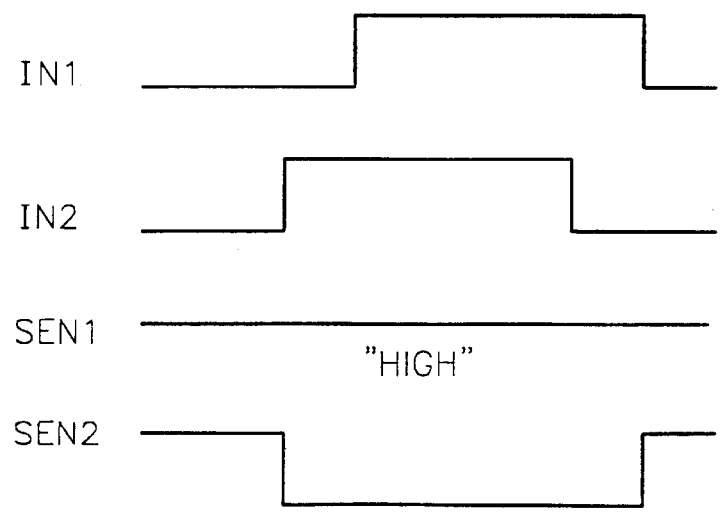

FIG. 8 is a timing diagram of the output signals of the pre-latch circuit 501 of FIG. 6 which shows a case where the first input signal IN1 is behind the second input signal IN2 in phase. In FIG. 8, the first sensing signal SEN1 has the same phase as that of the second sensing signal SEN2 of FIG. 7 and the second sensing signal SEN2 has the same phase as that of the first sensing signal SEN1 of FIG. 7.

Figure 9:
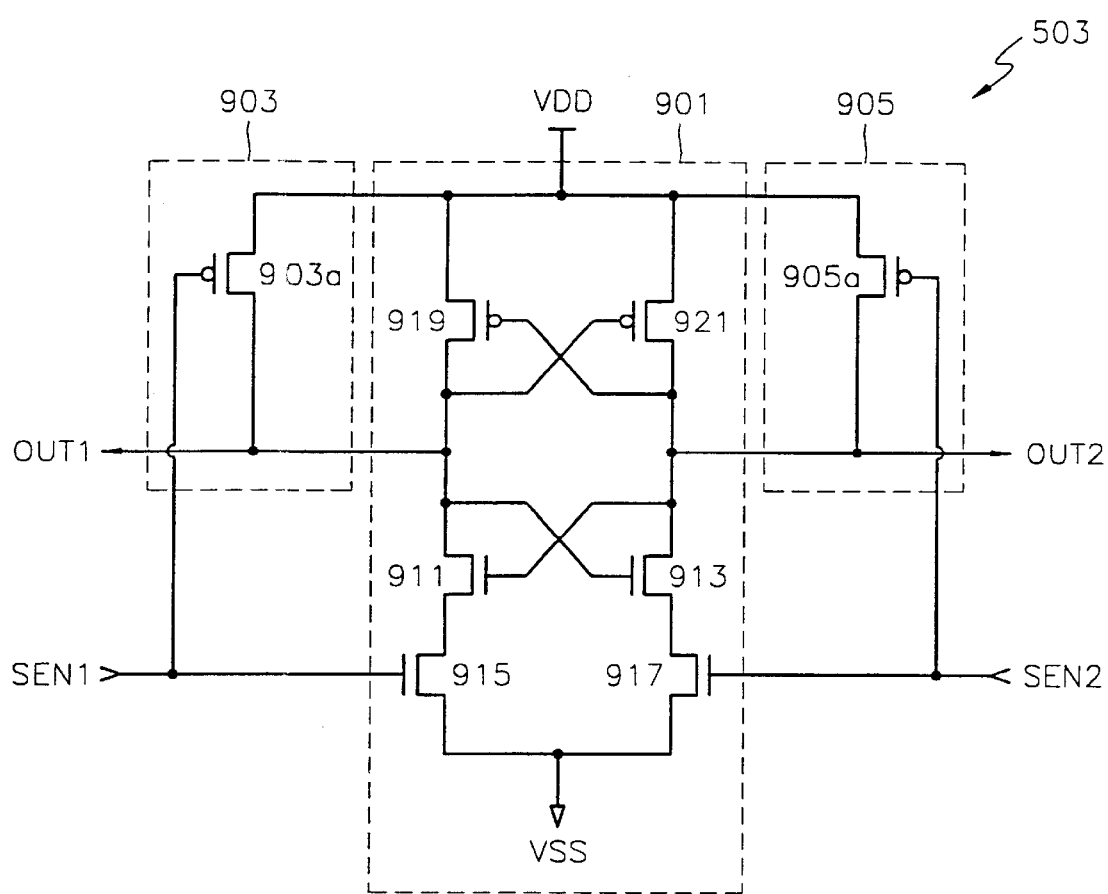
FIG. 9 is a detailed circuit diagram of one embodiment of a final latch circuit of FIG. 5.

FIG. 9 is a detailed circuit diagram of the final latch circuit 503 of FIG. 5. The final latch circuit 503 includes a latch 901 and first and second precharging units 903 and 905.

The latch 901 generates the first and the second output signals OUT1 and OUT2 in response to the first and the second sensing signals SEN1 and SEN2. In one embodiment, the latch 901 includes a plurality of NMOS transistors 911, 913, 915 and 917 and a plurality of PMOS transistors 919 and 921.

The NMOS transistor 915 is gated with the first sensing signal SEN1. A first junction of the NMOS transistor 915 is coupled to the ground voltage VSS. The NMOS transistor 917 is gated with the second sensing signal SEN2. A first junction of the NMOS transistor 917 is coupled to the ground voltage VSS.

The NMOS transistor 913 is gated with the first output signal OUT1. First and second junctions of the NMOS transistor 913 are connected with a node of the second output signal OUT2 and the second junction of the NMOS transistor 917 respectively. The NMOS transistor 911 is gated with the second output signal OUT2. First and second junctions of the NMOS transistor 911 are connected to the node of the first output signal OUT1 and the second junction of the NMOS transistor 915 respectively.

The PMOS transistor 919 is gated with the second output signal OUT2 and its first and second junctions are respectively coupled to the power supply voltage VDD and the node of the first output signal OUT1. The PMOS transistor 921 is gated with the first output signal OUT1 and its first and second junctions are respectively coupled to the power supply voltage VDD and the node of the second output signal OUT2.

In one embodiment, the first precharging unit 903 is a PMOS transistor 903a which is gated with the first sensing signal SEN1. The PMOS transistor 903a is connected between the power supply voltage VDD and the node of the first output signal OUT1. Accordingly, when the first sensing signal SEN1 is at a logic low, the first output signal OUT1 is precharged to a logic high.

The second precharging unit 905 is a PMOS transistor 905a which is gated with the second sensing signal SEN2. The PMOS transistor 905a is connected between the power supply voltage VDD and the node of the second output signal OUT2. Accordingly, when the second sensing signal SEN2 is at a logic low, the second output signal OUT2 is precharged to a logic high.

Accordingly, the logic states of the first and the second output signals OUT1 and OUT2 according to the logic states of the first and the second sensing signals SEN1 and SEN2 appear as shown in Table 2.

TABLE 2

| Cases | SEN1 | SEN2 | OUT1 | OUT2 |
|---|---|---|---|---|
| 1 | L | L | H | H |
| 2 | H | L | L | H |
| 3 | L | H | H | L |
| 4 | H | H | Previous state | Previous state |

In case 1 where the first and the second sensing signals SEN1 and SEN2 are at a logic low, the first and the second output signals OUT1 and OUT2 are at a logic high. However, as known from the timing diagrams of FIGS. 7 and 8, a case where both the first and the second sensing signals SEN1 and SEN2 are at a logic low does not occur. Accordingly, case 1 does not occur.

In case 2 where the first sensing signal SEN1 is at a logic high and the second sensing signal SEN2 is at a logic low, the first output signal OUT1 is at a logic low and the second output signal is at a logic high. In case 3 where the first sensing signal SEN1 is a logic low and the second sensing signal SEN2 is at a logic high, the first output signal OUT1 is at a logic high and the second output signal OUT1 is at a logic low. In case 4 where both the first and the second sensing signals SEN1 and SEN2 are at a logic high, the first and the second output signals OUT1 and OUT2 remain at their previous states.

As mentioned above, since case 1 is excluded, a case where both the first and second output signals OUT1 and OUT2 are at the same logic state does not occur. In other words, the final latch circuit 503 of FIG. 9 prevents the first and the second output signals OUT1 and OUT2 from being at the same logic state.

As described above, the TDC shown in FIGS. 4 through 9 generates the delay control signal group GDC according to the phase difference between the feedback signal FCLK11 and the internal clock signal ICLK1. The phase difference between the feedback signal FCLK11 and the internal clock signal ICLK1 is controlled to be reduced by the delay control signal group GDC.

Referring to FIG. 2, the delay locked loop according to this embodiment of the present invention converts the phase difference between the internal clock signal ICLK1 and the feedback signal FCLK11 into the delay control signal group GDC which is a digital signal. Then, the delay locked loop controls the second delay time of the mirror delay circuit 207 using the delay control signal group GDC, thereby rapidly reducing the phase difference between the internal clock signal ICLK1 and the feedback signal FCLK11.

Figure 10:
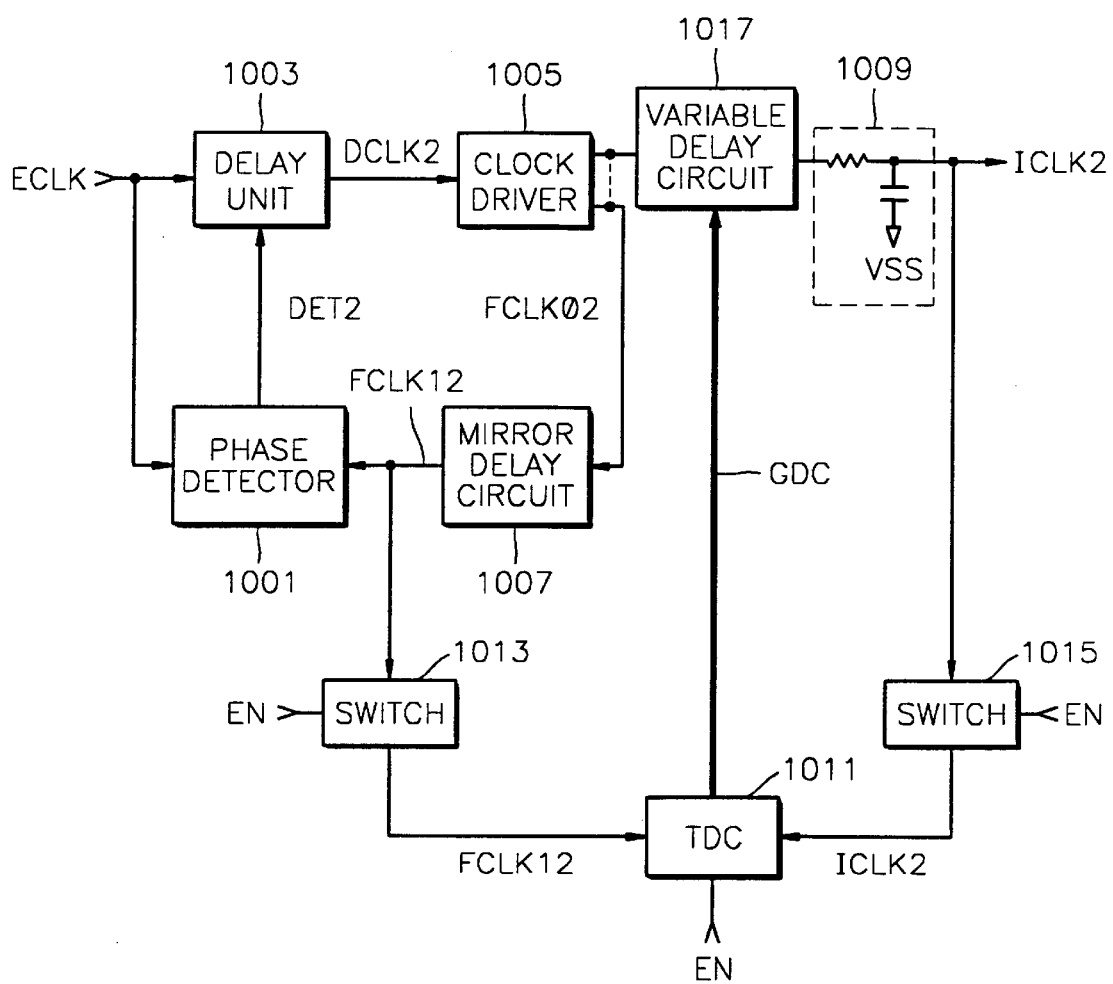
FIG. 10 is a schematic block diagram of a delay locked loop according to another embodiment of the present invention.

FIG. 10 is a schematic block diagram of a delay locked loop according to another embodiment of the present invention. The delay locked loop of FIG. 10 is similar to that of FIG. 2. Therefore, the reference numerals having the same last two digit numbers and the same characters in FIGS. 2 and 10 represent the same element.

The delay locked loop of FIG. 10 includes a variable delay circuit 1017 on a transmission path of an internal clock signal ICLK2. The delay time of the variable delay circuit 1017 is controlled by a delay control signal group GDC which is output from a TDC 1011. The delay time of a mirror delay circuit 1007 may be fixed. The variable delay circuit 1017 may be similar to the mirror delay circuit of FIG. 3.

The remainder of the embodiment of FIG. 10 is essentially the same as the embodiment of FIG. 2. Therefore, to avoid repetition, detailed description of the remainder of the FIG. 10 embodiment will be omitted.

Figure 11:
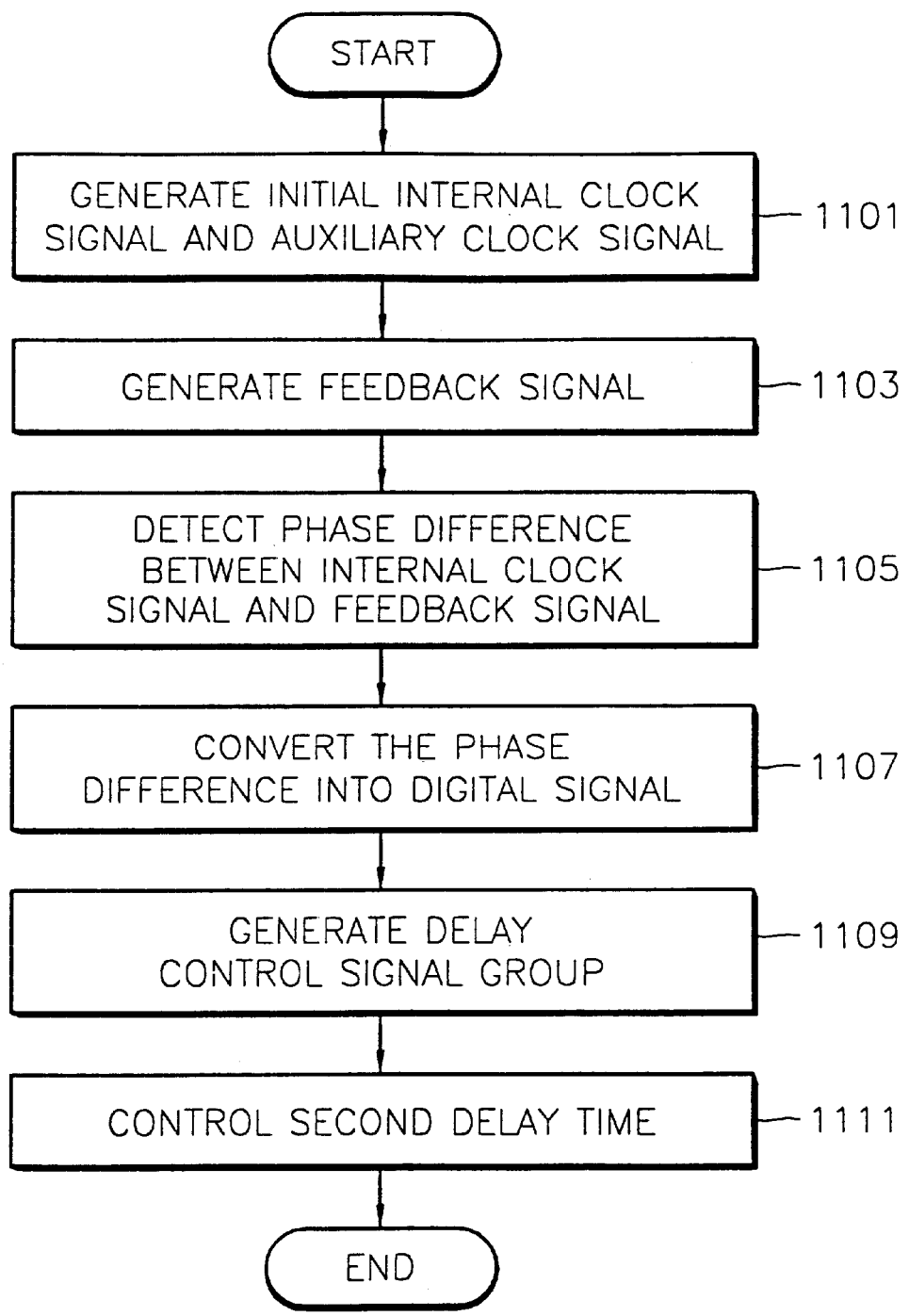
FIG. 11 is a flowchart of a locking method according to an embodiment of the present invention.

FIG. 11 is a flowchart of a locking method according to an embodiment of the present invention. The locking method can be carried out using the delay locked loop of FIG. 2 according to the embodiment of the present invention.

Referring to FIGS. 2 and 11, primarily, a reference clock signal ECLK is delayed to generate an initial internal clock signal PICLK1 and an auxiliary clock signal FCLK01 in step 1101. The auxiliary clock signal FCLK01 is delayed by the mirror delay circuit 207 and generated as a feedback signal FCLK11 in step 1103. The phase difference between an internal clock signal ICLK1 and the feedback signal FCLK11 is detected by the TDC 211 in step 1105. The detected phase difference between the internal clock signal ICLK1 and the feedback signal FCLK11 is converted into a digital signal by the TDC 211 in step 1107. A delay control signal group GDC is generated based on the converted digital signal in step 1109. In step 1111, the delay time of the mirror delay circuit 207 is controlled by the delay control signal group GDC to reduce the phase difference between the internal clock signal ICLK1 and the feedback signal FCLK11.

While this invention has been particularly shown and described with references to preferred embodiments thereof, it will be understood by those skilled in the art that various changes in form and details may be made therein without departing from the spirit and scope of the invention as defined by the following claims.

What is claimed is:

1. An integrated circuit having a locking circuit for generating an internal clock signal in synchronization with an input reference clock signal, wherein the internal clock signal is a signal obtained when an initial internal clock signal at an output terminal of the locking circuit is delayed by a predetermined time for which the initial internal clock signal is transmitted from the output terminal to an input terminal of a circuit at a predetermined distance from the output terminal, the locking circuit comprising:

an internal clock signal generator for (i) delaying the reference clock signal by a first delay time corresponding to the phase difference between the reference clock signal and a feedback signal that is controlled to have the same phase as that of the internal clock signal and (ii) generating the initial internal clock signal based on the delayed reference clock signal;

a mirror delay circuit for (i) delaying the initial internal clock signal by a second delay time in response to a predetermined delay control signal group and (ii) generating the feedback signal; and a time-to-digital converter for generating the delay control signal group for controlling the mirror delay circuit to reduce the phase difference between the feedback signal and the internal clock signal.

2. An integrated circuit having a locking circuit for generating an internal clock signal in synchronization with an input reference clock signal, wherein the internal clock signal is a signal obtained when an initial internal clock signal at an output terminal of the locking circuit is delayed by a predetermined time for which the initial internal clock signal is transmitted from the output terminal to an input terminal of a circuit at a predetermined distance from the output terminal, the locking circuit comprising:

an internal clock signal generator for (i) delaying the reference clock signal by a first delay time corresponding to the phase difference between the reference clock signal and a feedback signal that is controlled to have the same phase as that of the internal clock signal and (ii) generating the initial internal clock signal and an auxiliary clock signal based on the delayed reference clock signal;

a mirror delay circuit for (i) delaying the auxiliary clock signal by a second delay time in response to a predetermined delay control signal group and (ii) generating the feedback signal; and a time-to-digital converter for generating the delay control signal group for controlling the mirror delay circuit to reduce the phase difference between the feedback signal and the internal clock signal.

3. The locking circuit of claim 2, further comprising first and second switches driven respectively by the internal clock signal and the feedback signal, said switches being enabled for a predetermined period of time to provide output signals to the time-to-digital converter.

4. The locking circuit of claim 2, wherein the initial internal clock signal and the auxiliary clock signal are the same signal.

5. The locking signal of claim 2, wherein the internal clock signal generator comprises:

a phase detector for detecting the phase difference between the reference clock signal and the feedback signal and generating a phase difference signal corresponding to the phase difference;

a delay unit for delaying the reference clock signal by the first delay time to generate a delay clock signal, wherein the first delay time is controlled by the phase difference signal to reduce the phase difference between the reference clock signal and the feedback signal; and a clock driver driven by the delay clock signal for generating the initial internal clock signal and the auxiliary clock signal.

6. The locking circuit of claim 2, wherein the time-to-digital converter converts the phase difference between the internal clock signal and the feedback signal into a digital signal to generate the delay control signal group.

7. The locking circuit of claim 6, wherein the time-to-digital converter comprises:

a plurality of first phase comparators for sequentially delaying the internal clock signal and comparing the delayed signals with the feedback signal; and a plurality of second phase comparators for sequentially delaying the feedback signal and comparing the delayed signals with the internal clock signal, wherein the delay control signal group is composed of output signals of first and second phase comparators.

8. The locking circuit of claim 2, wherein the time-to-digital converter comprises:

a first delay chain for delaying the first input signal;

a second delay chain for delaying the second input signal;

a first phase comparator for generating an output signal, the logic state of which changes depending on the sign of the phase difference between an output signal of the first delay chain and the second input signal, which are respectively input through first and second input terminals of the first phase comparator; and a second phase comparator for generating an output signal, the logic state of which changes depending on the sign of the phase difference between an output signal of the second delay chain and the first input signal, which are respectively input through first and second input terminals of the second phase comparator.

9. The time-to-digital converter of claim 8, wherein each of the first and the second phase comparators comprises:

a pre-latch circuit for generating first and second sensing signals in response to input signals which are input through the first and the second input terminals, respectively, wherein one of the first and second sensing signals is activated during an interval from the transition of the one of the input signals earlier in phase to a first state to the transition of the one of the input signals later in phase to a second state; and a final latch circuit for latching and inversely latching the activated signal among the first and the second sensing signals to generate first and second latch signals.

10. The time-to-digital converter of claim 9, wherein the pre-latch circuit comprises:

a latch for (i) generating the first sensing signal, which is activated in response to the transition to the first state of the signal input through the first input terminal and then deactivated in response to the transition to the second state of the signal input through the second input terminal, the signal input through the first input terminal being earlier in phase than the signal input through the second input terminal, and (ii) generating the second sensing signal, which is activated in response to the transition to the first state of the signal input through the second input terminal and then deactivated in response to the transition to the second state of the signal input through the first input terminal, the signal input through the second input terminal being earlier in phase than the signal input through the first input terminal; and first and second precharging units for precharging the first and second sensing signals, respectively.

11. The time-to-digital converter of claim 10, wherein the latch comprises:
   a first MOS transistor which is gated with the signal input through the first input terminal and which has a first junction for generating the first sensing signal;
   a second MOS transistor which is gated with the signal input through the second input terminal and which has a first junction for generating the second sensing signal;
   a third MOS transistor which is connected between a second junction of the first MOS transistor and a ground voltage and which is gated with the second sensing signal;
   a fourth MOS transistor which is connected between a second junction of the second MOS transistor and the ground voltage and which is gated with the first sensing signal;
   a fifth MOS transistor which is connected between the first junction of the first MOS transistor and a power supply voltage and which is gated with the second sensing signal; and
   a sixth MOS transistor which is connected between the first junction of the second MOS transistor and the power supply voltage and which is gated with the first sensing signal.

12. The time-to-digital converter of claim 11, wherein the first through fourth MOS transistors are NMOS transistors and the fifth and the sixth MOS transistors are PMOS transistors.

13. The time-to-digital converter of claim 10, wherein the first precharging unit comprises a first PMOS transistor which is gated with the first sensing signal, and the second precharging unit comprises a second PMOS transistor which is gated with the second sensing signal.

14. The time-to-digital converter of claim 9, wherein the final latch circuit comprises:
   a latch for generating first and second output signals in response to the first and second sensing signals;
   a first precharging unit for precharging the first output signal in response to the first sensing signal; and
   a second precharging unit for precharging the second output signal in response to the second sensing signal.

15. The time-to-digital converter of claim 14, wherein the latch comprises:
   a first MOS transistor which is gated with the second output signal and which has a first junction for generating the first output signal;
   a second MOS transistor which is gated with the first output signal and which has a first junction for generating the second output signal;
   a third MOS transistor which is connected between a second junction of the first MOS transistor and a ground voltage and which is gated with the first sensing signal;
   a fourth MOS transistor which is connected between a second junction of the second MOS transistor and the ground voltage and which is gated with the second sensing signal;
   a fifth MOS transistor which is connected between the first junction of the first MOS transistor and a power supply voltage and which is gated with the second output signal; and
   a sixth MOS transistor which is connected between the first junction of the second MOS transistor and the power supply voltage and which is gated with the first output signal.

16. The time-to-digital converter of claim 15, wherein the first through fourth MOS transistors are NMOS transistors, and the fifth and the sixth MOS transistors are PMOS transistors.

17. The time-to-digital converter of claim 14, wherein the first precharging unit comprises a first PMOS transistor which is gated with the first sensing signal, and the second precharging unit comprises a second PMOS transistor which is gated with the second sensing signal.

18. An integrated circuit having a locking circuit for generating an internal clock signal in synchronization with an input reference clock signal, wherein the internal clock signal is a signal obtained when an initial internal clock signal at an output terminal of the locking circuit is delayed by a predetermined time for which the initial internal clock signal is transmitted from the output terminal to an input terminal of a circuit at a predetermined distance from the output terminal, the locking circuit comprising:
   an internal clock signal generator for (i) delaying the reference clock signal by a first delay time in response to the phase difference between the reference clock signal and a feedback signal which is controlled to have the same phase as that of the internal clock signal and (ii) generating a pre-clock signal and the feedback signal based on the delayed reference clock signal;
   a variable delay circuit for (i) delaying the pre-clock signal by a second delay time in response to a predetermined delay control signal group and (ii) generating the initial internal clock signal; and
   a time-to-digital converter for generating the delay control signal group for controlling the variable delay circuit to reduce the phase difference between the feedback signal and the internal clock signal.

19. The locking circuit of claim 18, farther comprising first and second switches respectively driven by the internal clock signal and the feedback signal, the first and second switches being enabled for a predetermined period of time to provide output signals to the time-to-digital converter.

20. The locking circuit of claim 18, wherein the internal clock signal generator comprises:
   a phase detector for detecting the phase difference between the reference clock signal and the feedback signal and generating a phase difference signal corresponding to the phase difference;
   a delay unit for delaying the reference clock signal by the first delay time to generate a delay clock signal, wherein the first delay time is controlled by the phase difference signal to reduce the phase difference between the reference clock signal and the feedback signal;
   a clock driver driven by the delay clock signal, for generating the pre-clock signal and an auxiliary clock signal; and
   a mirror delay circuit for delaying the auxiliary clock signal by a third delay time to generate the feedback signal, the third delay time reflecting a delay time from the pre-clock signal to the internal clock signal.

21. The locking circuit of claim 20, wherein the pre-clock signal and the auxiliary clock signal are the same signal.

22. The locking circuit of claim 18, wherein the time-to-digital converter converts the phase difference between the internal clock signal and the feedback signal into a digital signal to generate the delay control signal group.

23. The locking circuit of claim 22, wherein the time-to-digital converter comprises:
   a plurality of first phase comparators for sequentially delaying the internal clock signal and comparing the delayed signals with the feedback signal; and a plurality of second phase comparators for sequentially delaying the feedback signal and comparing the delayed signals with the internal clock signal, wherein the delay control signal group is composed of output signals of the first and second phase comparators.

24. The locking circuit of claim 18, wherein the time-to-digital converter comprises:

a first delay chain for delaying the first input signal;

a second delay chain for delaying the second input signal;

a first phase comparator for generating an output signal the logic state of which changes depending on the sign of the phase difference between an output signal of the first delay chain and the second input signal, which are respectively input through first and second input terminals of the first phase comparator; and a second phase comparator for generating an output signal the logic state of which changes depending on the sign of the phase difference between an output signal of the second delay chain and the first input signal, which are respectively input through first and second input terminals of the second phase comparator.

25. The time-to-digital converter of claim 24, wherein each of the first and the second phase comparators comprises:

a pre-latch circuit for generating first and second sensing signals in response to input signals which are input through the first and the second input terminals, respectively, wherein one of the first and second sensing signals is activated during an interval from the transition of the one of the input signals earlier in phase to a first state to the transition of the one of the input signals later in phase to a second state; and a final latch circuit for latching and inversely latching the activated signal among the first and the second sensing signals to generate first and second latch signals.

26. The time-to-digital converter of claim 25, wherein the pre-latch circuit comprises:

a latch for (i) generating the first sensing signal, which is activated in response to the transition to the first state of the signal input through the first input terminal and then deactivated in response to the transition to the second state of the signal input through the second input terminal, the signal input through the first input terminal being earlier in phase than the signal input through the second input terminal, and (ii) generating the second sensing signal, which is activated in response to the transition to the first state of the signal input through the second input terminal and then deactivated in response to the transition to the second state of the signal input through the first input terminal, the signal input through the second input terminal being earlier in phase than the signal input through the first input terminal; and first and second precharging units for precharging the first and second sensing signals respectively.

27. The time-to-digital converter of claim 26, wherein the latch comprises:

a first MOS transistor which is gated with the signal input through the first input terminal and which has a first junction for generating the first sensing signal;

a second MOS transistor which is gated with the signal input through the second input terminal and which has a first junction for generating the second sensing signal;

a third MOS transistor which is connected between a second junction of the first MOS transistor and a ground voltage and which is gated with the second sensing signal;

a fourth MOS transistor which is connected between a second junction of the second MOS transistor and the ground voltage and which is gated with the first sensing signal;

a fifth MOS transistor which is connected between the first junction of the first MOS transistor and a power supply voltage and which is gated with the second sensing signal; and a sixth MOS transistor which is connected between the first junction of the second MOS transistor and the power supply voltage and which is gated with the first sensing signal.

28. The time-to-digital converter of claim 27, wherein the first through fourth MOS transistors are NMOS transistors and the fifth and the sixth MOS transistors are PMOS transistors.

29. The time-to-digital converter of claim 26, wherein the first precharging unit comprises a first PMOS transistor which is gated with the first sensing signal, and the second precharging unit comprises a second PMOS transistor which is gated with the second sensing signal.

30. The time-to-digital converter of claim 25, wherein the final latch circuit comprises:

a latch for generating first and second output signals in response to the first and second sensing signals;

a first precharging unit for precharging the first output signal in response to the first sensing signal; and a second precharging unit for precharging the second output signal in response to the second sensing signal.

31. The time-to-digital converter of claim 30, wherein the latch comprises:

a first MOS transistor which is gated with the second output signal and which has a first junction for generating the first output signal;

a second MOS transistor which is gated with the first output signal and which has a first junction for generating the second output signal;

a third MOS transistor which is connected between a second junction of the first MOS transistor and a ground voltage and which is gated with the first sensing signal;

a fourth MOS transistor which is connected between a second junction of the second MOS transistor and the ground voltage and which is gated with the second sensing signal;

a fifth MOS transistor which is connected between the first junction of the first MOS transistor and a power supply voltage and which is gated with the second output signal; and a sixth MOS transistor which is connected between the first junction of the second MOS transistor and the power supply voltage and which is gated with the first output signal.

32. The time-to-digital converter of claim 31, wherein the first through fourth MOS transistors are NMOS transistors, and the fifth and the sixth MOS transistors are PMOS transistors.

33. The time-to-digital converter of claim 30, wherein the first precharging unit comprises a first PMOS transistor which is gated with the first sensing signal, and the second precharging unit comprises a second PMOS transistor which is gated with the second sensing signal.

34. A locking method for generating an internal clock signal which is synchronized with an input reference clock signal, the locking method comprising the steps of:

delaying the reference clock signal by a first delay time corresponding to the phase difference between the reference clock signal and a feedback signal which is controlled to have the same phase as that of the internal clock signal;

generating an initial internal clock signal and an auxiliary clock signal based on the delayed reference clock signal;

delaying the auxiliary clock signal by a second delay time;

generating the feedback signal;

detecting the phase difference between the internal clock signal and the feedback signal;

converting the phase difference between the internal clock signal and the feedback signal into a digital signal;

generating a predetermined delay control signal group based on the digital signal; and controlling the second delay time according to the delay control signal group to reduce the phase difference between the feedback signal and the internal clock signal.

* * * * *